(12) United States Patent
Sagareli

(10) Patent No.: US 11,614,476 B2
(45) Date of Patent: Mar. 28, 2023

(54) ELECTRICAL UTILITY MULTIFUNCTIONAL DEVICE

(71) Applicant: Consolidated Edison Company of New York, Inc., New York, NY (US)

(72) Inventor: Sergo Sagareli, Medford, NY (US)

(73) Assignee: CONSOLIDATED EDISON COMPANY OF NEW YORK, INC., New York, NY (US)

(*) Notice: Subject to any disclaimer, the term of this patent is extended or adjusted under 35 U.S.C. 154(b) by 212 days.

(21) Appl. No.: 16/988,973

(22) Filed: Aug. 10, 2020

(65) Prior Publication Data

US 2021/0048471 A1   Feb. 18, 2021

Related U.S. Application Data

(60) Provisional application No. 62/885,489, filed on Aug. 12, 2019.

(51) Int. Cl.
   *G01R 31/12*   (2020.01)
   *G01J 5/00*    (2022.01)

(52) U.S. Cl.
   CPC ........ *G01R 31/1272* (2013.01); *G01J 5/0025* (2013.01); *G01R 31/1209* (2013.01); *G01J 2005/0077* (2013.01)

(58) Field of Classification Search
   CPC ............. G01R 31/1272; G01R 31/1209; G01J 5/0025
   See application file for complete search history.

(56) References Cited

U.S. PATENT DOCUMENTS

| | | | |
|---|---|---|---|
| 6,179,122 B1 | 1/2001 | Moncrief et al. | |
| 9,439,092 B1* | 9/2016 | Chukka | H04W 24/04 |
| 9,823,289 B2* | 11/2017 | Pal | G01R 31/52 |
| 2013/0154651 A1* | 6/2013 | Laepple | G01R 27/20 |
| | | | 324/354 |
| 2014/0216157 A1* | 8/2014 | Wang-Lee | G01N 29/12 |
| | | | 73/579 |
| 2015/0319520 A1 | 11/2015 | Richardson et al. | |

(Continued)

FOREIGN PATENT DOCUMENTS

WO    WO-2007070942 A1 *  6/2007   ......... G01R 31/1245

OTHER PUBLICATIONS

Doble In-Service Testing & Assessment, DFA300, Radio Frequency Interference and Acoustic Signal Surveyor, Doble Engineering Company, Worldwide Headquarters, 85 Walnut Street, Watertown, MA 02472, www.doble.com, Aug. 2017; 2 pgs.

(Continued)

*Primary Examiner* — Alvaro E Fortich
(74) *Attorney, Agent, or Firm* — Cantor Colburn LLP

(57) ABSTRACT

A system and method for use in environment with electrical equipment is provided. The system including a housing and at least one light source located on an exterior of the housing. The light source being activated when the system is in a switching mode of operation. At least one sensor is operably coupled to the housing and configured to measure at least one parameter associated with the electrical equipment. A computing device is disposed within the housing and coupled to communicate with the at least one light source and the at least one sensor.

17 Claims, 2 Drawing Sheets

(56) References Cited

U.S. PATENT DOCUMENTS

2016/0156880 A1* 6/2016 Teich ................ H04N 5/265
  348/82
2016/0229533 A1* 8/2016 van Cruyningen ... B64C 31/024
2016/0349305 A1* 12/2016 Pal ..................... G01R 31/52

OTHER PUBLICATIONS

Flir One® Pro-Series "Professional-Level Thermal Imaging for Your Smartphone" Brochure © 2018, FLIR Systems, Inc.27700 SW Parkway Ave., Wilsonville, OR 97070; 2 pgs.

Kim, J. H., et al., "Development of a wireless PD measurement system enabling to Contact directly with 22.9kV Live line of Gas Switchgear" CIGRE 2018, Paris, D1-303; 6 pgs.

* cited by examiner

ELECTRICAL UTILITY MULTIFUNCTIONAL DEVICE

CROSS REFERENCE TO RELATED APPLICATIONS

This application claims the benefit of U.S. Provisional Application Ser. No. 62/885,489, filed Aug. 12, 2019, the entire disclosure of which is incorporated herein by reference.

BACKGROUND

The subject matter disclosed herein relates to a system for inspecting electrical utility environments, such as an electrical power plant or a substation. In particular, a system is disclosed that provides warning signal during high voltage switching in a station, as well as physical protection for the device that is used for various purposes by station operators and mechanics.

Electrical utility processes and procedures often require personnel to perform inspections. These inspections can include overheating equipment, incipient faults in high voltage equipment insulation, and to locate intruders or animals within the environment. During another procedure performed by operators—switching of the high voltage equipment, —it is important that the personnel performing the switching are not disturbed by other personnel. Current practice is to print a switching order on a colored (e.g. pink) paper and place it on a clip board that is carried by the personnel performing the action, so it is clearly visible to others who may be entering the environment. As the electric utilities shift from paper to electronic media, the switching orders are provided to operators in electronic format and displayed on the surface of the tablet. Images and colors on the tablet screen are visible only from very short distance and from only certain angles.

The personnel may use a variety of discreet, individual, sensing devices to perform the inspection. For example, it is often desired to check the operating temperature of equipment, or parts thereof, that do not have a temperature gauge, such as but not limited to: disconnect switches, bushings, and bus sections. To perform these inspections, an infrared camera may be used. The infrared camera may also be used to check for animals or intruders who have entered the environment without authorization. It should be appreciated that when using discreet, hand held, sensing devices, the operator will typically only be able to use one sensing device at a time.

Accordingly, while existing electrical utility sensing processes are suitable for their intended purposes the need for improvement remains, particularly in providing a sensor system having the features described here.

BRIEF DESCRIPTION

According to one aspect of the disclosure, a sensing system for use in environment with electrical equipment is provided. The system including a housing and at least one light source located on an exterior of the housing, the light source being activated when the system is in a switching mode of operation. At least one sensor is operably coupled to the housing and configured to measure at least one parameter associated with the electrical equipment. A computing device is disposed within the housing and coupled to communicate with the at least one light source and the at least one sensor.

According to another aspect of the disclosure a method of inspecting and switching of an electrical utility electrical equipment is provided. The method comprising: activating a multifunctional system, the multifunctional system having a housing with at least one light source at least partially coupled to an exterior surface, the multifunctional system further having a plurality of sensors configured to measure one or more parameters associated with the electrical equipment; emitting light from the light source in response to activating the system when Operator is completing a switching order; carrying, by the operator, the multifunctional system to a location adjacent to the electrical equipment; and measuring at least one parameter of the plurality of parameters with at least one sensor of the plurality of sensors.

These and other advantages and features will become more apparent from the following description taken in conjunction with the drawings.

BRIEF DESCRIPTION OF DRAWINGS

The subject matter, which is regarded as the disclosure, is particularly pointed out and distinctly claimed in the claims at the conclusion of the specification. The foregoing and other features, and advantages of the disclosure are apparent from the following detailed description taken in conjunction with the accompanying drawings in which:

The detailed description explains embodiments of the disclosure, together with advantages and features, by way of example with reference to the drawings.

DETAILED DESCRIPTION

Embodiments of the present disclosure provide for a sensor system for performing inspections in environments having electrical equipment, such as an electrical power plant or an electrical substation for example. Embodiments disclosed herein allow an operator to measure multiple parameters simultaneously. In case of operator performing high voltage equipment switching, it is also providing an indicator to other personnel that the operator is performing the switching and should not be disturbed or interfered with.

Figure 1:
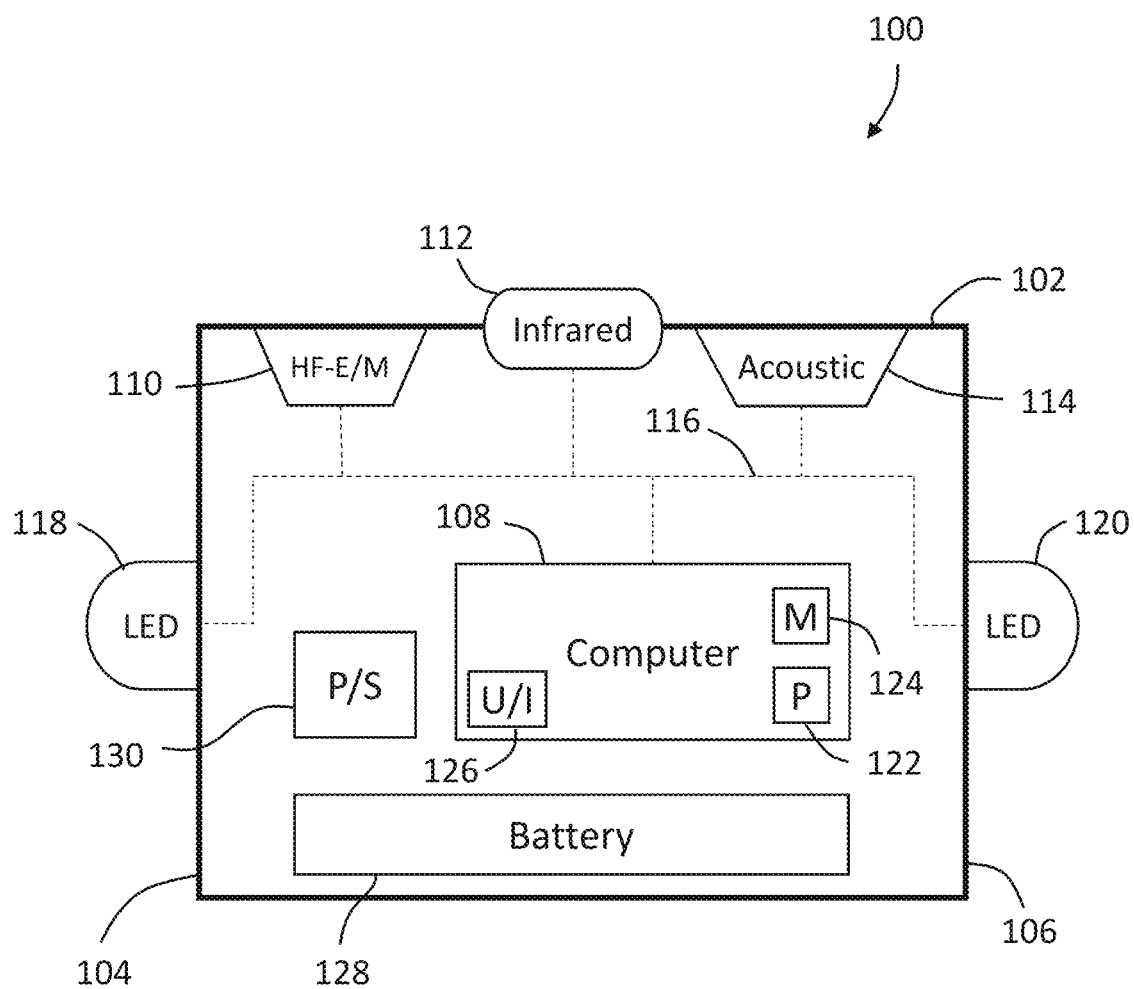
FIG. 1 is a schematic illustration of a sensing and warning system for use in inspecting an electrical utility environment and for providing visual warning to personnel in station when Operator is performing a switching, in accordance with an embodiment.

Referring now to FIG. 1, an embodiment is shown of a sensing and warning system 100. The system 100 includes a protective housing 102 with a pair of opposing sides 104, 106. Disposed within the housing 102 is a computational device 108, such as a tablet or a laptop computer for example. Coupled for communication to the computing device 108 are a plurality of sensors 110, 112, 114. The sensors 110, 112, 114 communicate with the computing device 108 via a communications medium 116. The communications medium may include wired communications (e.g. universal serial bus or ethernet), wireless communications (e.g. Bluetooth™, or IEC 802.11), or a combination of the foregoing.

The multifunctional system 100 includes at least one light source 118 that provides an indication to personnel in the area that the operator is performing a switching and cannot be disturbed or interrupted. In the exemplary embodiment, there are two light sources 118, 120 that are positioned on the first side 104 and the second side 106 respectively. By positioning the light sources 118, 120 on each side of the system 100, an indication that the system is in use will be visible to others in the area. In the exemplary embodiment, the light sources are a continuous light emitting diode (LED). In an embodiment, the LED light sources may be colored (e.g. red).

In the exemplary embodiment, the computing device 108 includes one or more processors 122 that are electrically connected to memory 124. The memory 124 may include random access memory (RAM) devices, non-volatile memory (NVM) devices, and read-only memory (ROM) devices. The computing device 108 is a suitable electronic device capable of accepting data and instructions, executing the instructions to process the data, and presenting the results. The computing device may accept instructions through user interface 126, such as a touch screen for example. In the exemplary embodiment, the computing device 108 is a tablet computer.

In an embodiment, computing device 108 is capable of converting the analog voltage or current level provided by sensors 110, 112, 114 into a digital signal indicative of parameters (e.g. temperature) of electrical components in the environment. Alternatively, sensors 110, 112, 114 may be configured to provide a digital signal to computing device 108, or an analog-to-digital (A/D) converter (not shown) maybe coupled between sensors 110, 112, 114 and computing device 108 to convert the analog signal provided by sensors 110, 112, 114 into a digital signal for processing by computing device 108. The digital signals represent one or more system 100 data including but not limited to temperature, locations of animals or intruders, and potential incipient faults in high voltage equipment insulation and the like.

Computing device 108 includes operation control methods embodied in application code. These methods are embodied in computer instructions written to be executed by processor 122, typically in the form of software. The software can be encoded in any language, including, but not limited to, assembly language, VHDL (Verilog Hardware Description Language), VHSIC HDL (Very High Speed IC Hardware Description Language), Fortran (formula translation), C, C++, C#, Objective-C, Visual C++, Java, ALGOL (algorithmic language), BASIC (beginners all-purpose symbolic instruction code), visual BASIC, ActiveX, HTML (HyperText Markup Language), Python, Ruby and any combination or derivative of at least one of the foregoing. Additionally, an operator can use an existing software application such as a spreadsheet or database and correlate various cells with the variables enumerated in the algorithms. Furthermore, the software can be independent of other software or dependent upon other software, such as in the form of integrated software.

In an embodiment, the system 100 may include a power source 128, such as a battery for example, for providing electrical power to the computing device 108, the sensors 110, 112, 114, the light sources 118, or a combination of the foregoing. In an embodiment, the system 100 may include a power supply 130 that adapts the electrical power, voltage or current from the power source 128 to a form that is suitable for the computation device 108, the sensors 110, 112, 114, or the light sources 118.

In an embodiment, the system 100 may include additional computer memory for the purpose of enhancing the capabilities of computing device 108. In an embodiment, the memory takes the form of USB connected FLASH memory. This memory can be used for storing the appropriate software for use on the computing device 108 to interface with the system 100.

In an embodiment, the sensor 110 is a high frequency electromagnetic sensor for detection of partial discharge in electrical insulation of high voltage equipment. In an embodiment, the sensor 112 is an infrared camera. The infrared camera 112 may be used by the operator to determine temperature of components, or also to locate animals or intruders within the environment. In an embodiment, the sensor 114 is an acoustic based partial discharge sensor. In an embodiment, the acoustic sensor 114 is configured to receive ultrasonic wavelength sound waves.

Figure 2:
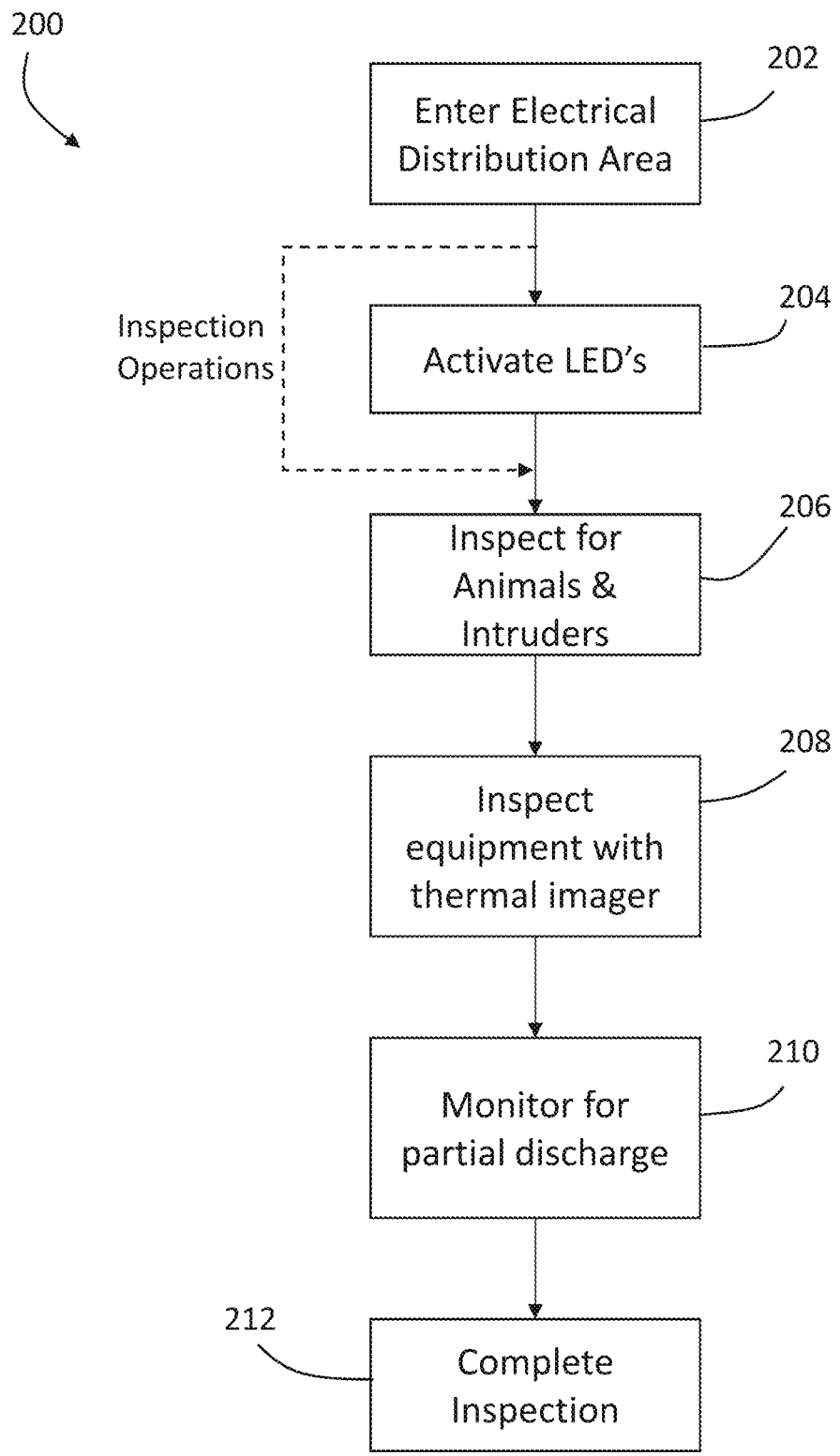
FIG. 2 is a flow diagram of a method of inspecting an electrical utility environment and performing a switching of high voltage equipment.

Referring now to FIG. 2, a method 200 is shown for inspecting an environment having electrical components, such as an electrical substation or a power generation plant for example. The method 200 starts with the operator entering the environment with the sensor system 100 in block 202. If the Operator has to proceed with switching order, the method 200 then proceeds to block 204 where the operator activates the LED light sources 118, 120. This notifies others in the environment that the operator is performing switching order and should not be disturbed. If the Operator is performing inspection, the method 200 bypasses block 204 and proceeds to block 206 where the operator uses the infrared sensor 112 to survey the environment and inspect for animals or intruders. The method 200 then proceeds to block 208 where the electrical components are inspected using the infrared camera to determine their operating temperature.

The method 200 then proceeds to block 210 where the operator monitors for partial discharge conditions (degradation of insulation) using the high-frequency electromagnetic sensor 110 and acoustic sensor 114. It should be appreciated that one or more of blocks 206, 208, 210 may be performed simultaneously. The method 200 ends in block 212 once the operator has completed inspecting the desired electrical components.

The term "about" is intended to include the degree of error associated with measurement of the particular quantity based upon the equipment available at the time of filing the application. For example, "about" can include a range of ±8% or 5%, or 2% of a given value.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection".

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the disclosure is provided in detail in connection with only a limited number of embodiments, it should be readily understood that the disclosure is not limited to such disclosed embodiments. Rather, the disclosure can be modified to incorporate any number of variations, alterations, substitutions or equivalent arrangements not heretofore described, but which are commensurate with the spirit and scope of the disclosure. Additionally, while various embodiments of the disclosure have been described, it is to be understood that the exemplary embodiment(s) may include only some of the described exemplary aspects. Accordingly, the disclosure is not to be seen as limited by the foregoing description, but is only limited by the scope of the appended claims.

What is claimed is:

1. A sensing system for use in environment with electrical equipment, the system comprising:
    a housing;
    at least one colored light source located on an exterior of the housing, the light source being activated when the system is in a switching mode of operation;
    a plurality of sensors disposed within the housing and configured to measure a plurality of parameters, the plurality of parameters including a partial discharge condition, a heat signature of an animal, and a temperature of a component within the environment; and
    a computing device disposed within the housing and coupled to communicate with the at least one light source and the plurality of sensors, wherein the computing device is configured to record the plurality of parameters from the plurality of sensors simultaneously.

2. The system of claim 1, wherein:
    the housing includes a first side and a second side; and
    the at least one light source includes a first light source coupled to the first side and a second light source coupled to the second side, the first light source and the second light source being different colors.

3. The system of claim 2, wherein at least the first light source has a red color.

4. The system of claim 2, wherein the first light source and second light source are continuous colored light emitting diode (LED) light sources.

5. The system of claim 1, wherein at least one of the plurality of sensors is a thermal imaging camera.

6. The system of claim 1, wherein at least one of the plurality of sensors is an acoustic based partial discharge sensor.

7. The system of claim 1, wherein at least one of the plurality of sensors is a high-frequency electromagnetic sensor for partial discharge detection.

8. The system of claim 1, further comprising a battery electrically coupled to at least one of the at least one sensor or the computing device.

9. A method of inspecting and switching of an electrical utility electrical equipment, the method comprising:
    activating a multifunctional system, the multifunctional system having a housing with at least one light source at least partially coupled to an exterior surface, the multifunctional system further having a plurality of sensors configured to measure a plurality of parameters associated with the electrical equipment, the plurality of parameters including a partial discharge condition, a heat signature of an animal, and a temperature of a component within the environment;
    emitting light from the light source in response to activating the system when Operator is completing a switching order;
    carrying, by the operator, the multifunctional system to a location adjacent to the electrical equipment; and
    measuring the plurality of parameters simultaneously with of the plurality of sensors.

10. The method of claim 9, wherein the multifunctional system includes a computing device coupled to communicate with the plurality of sensors and the at least one light source.

11. The method of claim 10, further comprising recording with the computing device, at least one of the plurality of parameters that is measured by at least one sensor of the plurality of sensors.

12. The method of claim 11, wherein the at least one of the plurality of sensors is an infrared camera.

13. The method of claim 12, further comprising locating an animal in the environment with the infrared camera.

14. The method of claim 11, wherein the measuring of the plurality of parameters includes measuring a sound.

15. The method of claim 14, wherein the sound has an ultrasonic wavelength.

16. The method of claim 11 wherein the measuring of the plurality of parameters includes measuring a predetermined radio frequency.

17. The method of claim 16, wherein the at least one of the plurality of sensors is a high-frequency electromagnetic sensor.

* * * * *